DOPING OF SEMICONDUCTOR SURFACES

Filed March 19, 1968

INVENTOR.
MILTON GENSER
BY Peter J. Gaylor
ATTORNEY

United States Patent Office 3,532,563

Patented Oct. 6, 1970

3,532,563

DOPING OF SEMICONDUCTOR SURFACES

Milton Genser, 10 Lancer Drive,
Short Hills, N.J. 07078

Filed Mar. 19, 1968, Ser. No. 714,287
Int. Cl. H01l 7/00
U.S. Cl. 148—188 13 Claims

ABSTRACT OF THE DISCLOSURE

Semiconductor surfaces are doped with an aqueous solution of the doping chemical in a carrier of a water soluble polymer having a molecular weight of over about 1000. This dopant can include a photosensitive compound, such as a water soluble dichromate which produces insolubility upon exposure to light.

BACKGROUND OF THE INVENTION

In the manufacture of commercial semi-conductors, semiconductor wafers, such as wafers of silicon or germanium, are provided with p-n junctions, which make up the devices in the form of patterns of "p" and "n" regions. These patterns are created by the diffusion of specific elements, known as dopants, into the top, and, in some cases, the bottom surfaces of the wafers. It is common practice to first coat the wafer surfaces with a thin layer of a masking material, which serves to totally prevent or delay access to the semiconductor surface to the action of the dopant element or compound. Generally, predetermined regions of the semiconductor surface are exposed to the action of the dopant chemical, after the masking material has been removed from such regions by a conventional photolithographic process, combined with a chemical etching operation.

These well know operations are employed in producing the family of silicon integrated circuits and planar devices. In such cases, the masking material consists of silicon dioxide, commonly produced by direct oxidation of the silicon wafer surface at high temperature. Selected regions of the silicon dioxide masking coating are removed by use of a photo resist and by chemical etching of the dioxide. By its inherent nature, the oxidation process produces a thin masking silicon dioxide layer, of the order of about 0.2 to 1 micron in thickness. The doping of the selected regions of the wafer is carried out by exposing, to the action of the doping chemicals, the silicon wafer surface, coated with the silicon dioxide mask in which apertures have been produced, as already described.

The commonly-employed dopants used in the art are boron and phosphorus. As is well known, boron will tend to make silicon "p" type junctions, whereas phosphorus will make "n" type junctions. For various technical reasons well known in the art, either in the form of a production process, or as a requirement in the device design, it is also desirable to dope, at the same time, selected regions of the silicon surface with other chemical elements falling in the same periodic chart columns, i.e., with arsenic, antimony, indium, gallium or aluminum.

The deposition and diffusion of the desired dopants has been commonly carried out in the prior art by one of three techniques: (1) Exposure of the silicon wafers in a high temperature furnace to vapors of the dopant chemicals, mixed with a carrier gas. In spite of needed careful control, the temperature is such that some diffusion of the dopant element does take place into undesired portions of the silicon surface. (2) Coating of the wafers with the dopant chemical by evaporation or electroplating at relatively lower temperature. In such case, the wafers are inserted in a suitable furnace at a temperature high enough so that diffusion can occur. (3) Coating of the wafers with a solution consisting of the dopant dissolved in a suitable solvent which is generally removed by mild heating, whereby the dopant element is left on the semiconductor surface.

While all of these methods have been employed in varying degrees, their use has been subject to some serious limitations. In the case of the latter two techniques previously mentioned, where dopant coatings are applied to the semiconductor surface prior to the diffusion operation, it has been found that it is difficult to control the thickness of the dopant coating so that reaction of the dopant with the silicon dioxide or other masking coating does not occur to a sufficient extent that the masking layer becomes pitted and destroyed. For example, most of the coating solutions discussed in the last two techniques already outlined, consist of boric acid or phosphorus pentoxide dissolved in alcohol or other volatile solvent, so that, upon rapid evaporation of the solvent, the resulting dopant coating is boric acid or phosphoric acid or oxide. Unless these compounds are present in a rigorously controlled thin film, they will dissolve in the masking dioxide material sufficiently to expose the silicon semiconductor surface to dopant action so that doping will occur in unwanted areas. Furthermore, with such volatile dopant solutions, it is difficult to insure continuity of the dopant layer, so that some exposed surfaces will not receive the required amount of dopant chemical.

The first doping technique mentioned above is the most commonly-used process of the prior art, and it does provide control of dopant action to prevent masking failure. However, this method has the disadvantage of difficulty in maintaining a uniform dopant carrier gas mixture. This condition also limits the number of semiconductor wafers which can be processed in a single run, and particularly because only a dilute dopant carrier gas mixture may be employed, as otherwise excess dopant will have a deleterious effect upon the masking layer. If a large enough charge of wafers is exposed in the furnace, the forward wafers in the furnace absorb dopant earlier, so that there is less dopant in the atmosphere for the rear wafers. Furthermore, the dopant chemicals are carried off by the carrier gas to cooler regions of the furnace tube liner, so that there is always the necessity of cleaning the tubes, resulting in a large amount of down time as well as a lower useful life for the furnace tubes. Besides commonly-employed dopant chemicals, such as boron tribromide, phosphorus oxychloride, phosphine and diborone are toxic and otherwise hazardous.

In Pat. No. 3,084,079, there are disclosed boron-containing water-insoluble trimethoxyboroxine polymers, either alone, or dissolved in methyl trimethoxysilane, which is limited specifically to boron doping of non-planar devices. The material thickens on heating, and extremely uniform films are not readily produced. Also, as far as is known, the material cannot be made photosensitive.

Pat. No. 3,019,142 employs antimony oxide dissolved in acetic acid, as a dopant. The acid is volatile, and difficulty is experienced, not only in obtaining a uniform film on the semiconductor surface, but it is also very difficult to obtain precise control of the dopant adhering to the surface. As already stated, the limited application of such material will leave bare regions which will not be doped.

There has been need in the art for a dopant which is not limited to any specific semiconductor or material, which can be made photosensitive, which may be applied uniformly over the masked semiconductor surface without impairing the protected portion, and which involves very little risk and hazard.

SUMMARY OF THE INVENTION

According to the present invention, a family of dopants has been developed which avoids or eliminates the aforesaid difficulties. These dopants comprise solutions of the doping chemical in water soluble continuous film-forming polymeric compounds. It is believed that, in the course of the heating operation, the dopant chemicals attach chemically to the polymer chain of the film-forming carrier compound. The carrier compounds comprise polymers higher than pentamers, and such polymers carry free hydroxy groups, sufficient in number to make the polymer water soluble. These polymers are desirably of molecular weights above about 1000, and preferably above about 5,000 or 10,000. Examples of such polymer compounds are polyvinyl alcohol, regenerated cellulose, methyl cellulose, lower molecular weight urea-formaldehyde condensation products, polyglycols, polyolefin oxides, such as ethylene or propylene polyoxides and their water-soluble condensation products, agar, guar gum, algin, and the like.

The aforesaid polymer, and the dopant solutions made therefrom, should be free of foreign ions, known in the trade to include alkali metals, alkali earth metals, as well as other elements known in the art to be injurious in the manufacture and performance of semiconductor devices. When applied by use of a conventional spinner (used in the art for application of photo-resist compositions), the dopants of the present invention dry to a hard adherent film of quite uniform thickness. The polymeric carrier film decomposes at high temperatures to carbon dioxide and water which leave no residues and which pass off harmlessly with the exhaust furnace vapors, and without contamination of the furnace surfaces.

The extent of surface doping may be readily controlled by selection of the temperature for the deposition, as well as by the concentration of dopant chemical. Since the polymers are water soluble, the concentration in the water solvent also is readily controllable. Because of the ability of the film to harden after application by selection of the spinning speed, it is possible to control precisely the amount of available dopant chemical, so that the semiconductor (e.g., silicon) is doped to the desired concentration, without fear of penetration or destruction of the masking material (e.g., dioxide).

Another valuable feature of the present invention is that the dopants may be rendered photosensitive to ultraviolet light by addition thereto of a suitable photosensitizer, as will be outlined further. In this way, it is possible to carry out patterned diffusion operations without the necessity of growing silicon dioxide masking layers, for example, and etching windows in these layers prior to doping. In this manner, several processing steps are eliminated. Furthermore, since the dioxide etching step tends to introduce pinhole imperfections in the masking layer, fewer rejects result when the aforesaid photosensitized dopants are employed.

BRIEF DESCRIPTION OF THE DRAWINGS

The invention will be more readily understood by reference to the accompanying drawing in which a preferred embodiment is described, and in which.

The same numerals refer to similar parts in the various figures.

DESCRIPTION OF THE PREFERRED EMBODIMENTS

Figure 1:
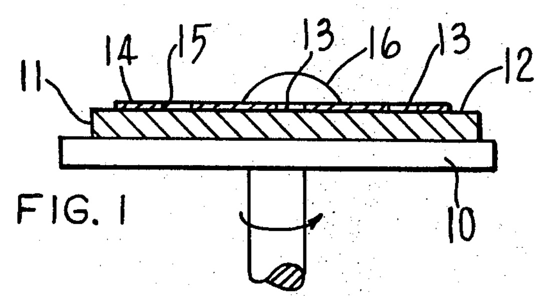
FIG. 1 depicts a cross-sectional schematic and exaggerated view of a masked silicon semiconductor wafer mounted on a chuck in a vacuum chamber, with dopant applied.

Referring to the drawing, numeral 10 refers to a rotable chuck mounted in a vacuum chamber (not shown) which may be heated. On the chuck is mounted the semiconductor, such as a silicon wafer 11 having an upper surface 12 on which selected areas 13 are to be doped. This is effected by first oxidizing the silicon surface 12 to form a layer 14 of silicon dioxide which is intended to be impenetratable to the action of the doping chemical under the preselected doping conditions. Thereafter, preselected areas 15 of the dioxide layer, corresponding to areas 13 on the wafer surface, are etched away by conventional photolithographic processes to leave exposed the silicon surface areas 13 which are to be doped. The aforesaid steps, depicted in FIG. 1, are well known in the art.

After the desired silicon surface areas 13 are exposed, a solution of the dopant of the present invention is applied, as at 16 (FIG. 1), on top of the etched dioxide layer 14. Thereafter, the chuck 10 is spun until the dopant 16 is distributed evenly as a coating 16′ of uniform thickness, in which the doping chemical is also uniformly distributed, say in the proportion of about 0.1% to about 1.0%, or more, by weight, in the dopant solution, as applied. The dopant solution also contains the polymeric carrier in a concentration of about 5% to about 20%, by weight, dissolved in the aqueous medium. The concentration of carrier and doping chemical may vary, depending upon the conditions of temperature and pressure during the diffusion process, as well as upon the diffusion depth desired for the particular semi-conductor application.

Figure 2:
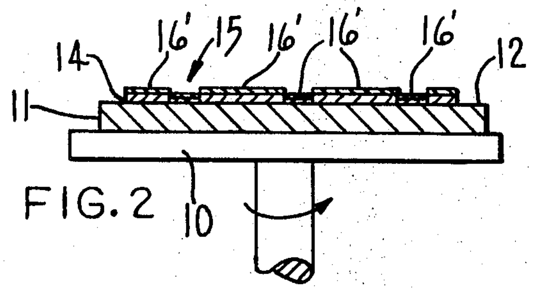
FIG. 2 illustrates a similar view after spinning whereby a dopant film is spread over the mask.

After the dopant has been spun, as in FIG. 2, the semiconductor is heated, applying conventional conditions of temperature and pressure. During this step (FIG. 3), the water and polymer are driven off or decomposed to harmless gases, and the liberated doping chemical diffused into the exposed silicon surfaces 13 to form the desired p or n junction 13′.

Figure 4:
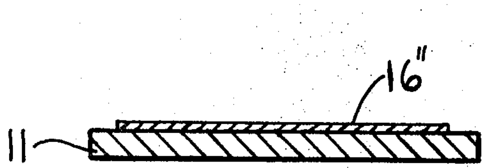
FIG. 4 shows a similar view (as in FIG. 3) of a silicon wafer coated with a spun film of dopant carrying a photosensitive chemical.
Figure 5:
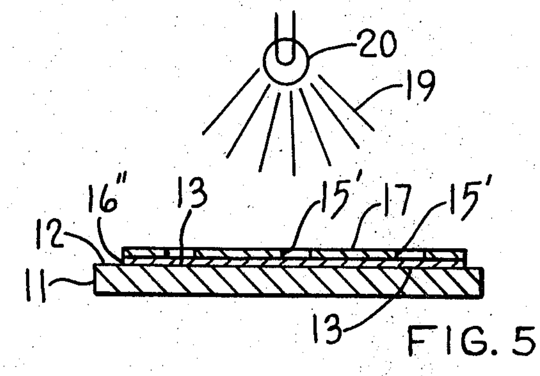
FIG. 5 illustrates the wafer of FIG. 4 with a mask applied thereover and the exposed doped wafer portions irradiated with ultra-violet light.

In FIGS. 4–7, the use of photosensitized diffusion processes is depicted. In this case, the silicon wafer 11 of FIG. 4 is provided with a uniformly spun dopant coating 16″, as in FIGS. 1–2, with the exception that the dopant now contains a dissolved photosensitive chemical in a concentration of about 0.05% to about 1.0%, by weight, or more. The thus-coated silicon surface is covered by a mask 17 having openings 15′ over the locations 13 where doping of the silicon surface is to take place.

Thereafter, the masked semiconductor is irradiated (FIG. 5) with ultra-violet light 19 from an ultra-violet light source, such as a lamp 20, until the dopant layer 16″, which is exposed to the rays, becomes insoluble in the leaching solvent, such as water. The mask 17 is then removed, and the unexposed layer 16″, etc., of dopant is washed off with the solvent (e.g., water), leaving the insoluble portions 18 of the dopant disposed over the areas 13 of the silicon surface to be doped (FIG. 6).

Figure 3:
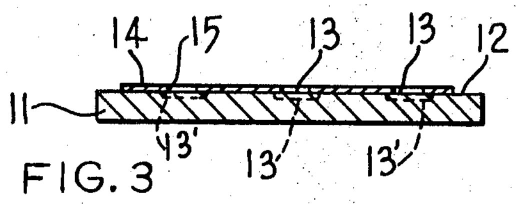
FIG. 3 presents a similar view (without the chuck) after heating of the masked wafer to affect doping of the exposed wafer surfaces.
Figure 6:
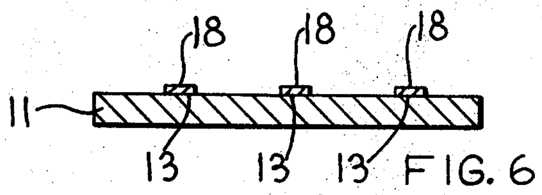
FIG. 6 presents the wafer of FIG. 5 after devolpment and washing off of the unexposed dopant.
Figure 7:
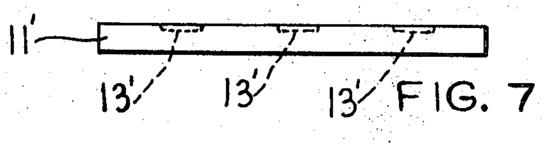
FIG. 7 depicts the wafer of FIG. 6 after heating to permit the dopant to diffuse into the doped areas.

Finally, the semiconductor of FIG. 6 is subjected to heat, as in the case of FIG. 3, and the silicon semiconductor 11′ is obtained having the desired diffused junctions 13′, as in FIG. 7. During the diffusion operation, the water (if any) is evaporated, and the carrier polymer is decomposed to harmless gases or vapors.

The invention will be more readily understood from the following examples which are submitted for the purpose of illustration, it being understood that the invention is not limited thereby:

EXAMPLE 1

To 50 ml. of water are added 5 grams of polyvinyl alcohol free of foreign metal ions. This mixture is heated until the polymer is completely dissolved, and a clear solution is formed. A 5%, by weight, of boric acid aqueous solution is then prepared. About 10 grams of the latter solution are added to the polymer solution with stirring, until a clear solution results. The latter resulting solution then is applied to a 10 ohm cm. "n" type silicon wafer so as to form a thin continuous uniform film. A spinner chuck, commonly employed in the art for applying photoresist solutions, serves to give a satisfactory film.

The wafer, of course, has been previously oxidized by known means to produce a dioxide coating, and "windows" were etched in the dioxide coating, by known means, to expose the silicon surfaces where the "p" type junctions were to be prepared.

The wafer then is heated to about 950° C., or to a higher temperature up to but not at the melting point of the wafer, whereupon the boron diffuses into the silicon surface at the predetermined locations to effect a "p" type junction. No diffusion takes place where the silicon dioxide coating was present to protect the silicon layer.

Replacement of the boron compound with other doping compounds, such as indium trichloride or gallium trichloride will result in the production of "p" type junctions, as outlined above.

EXAMPLE 2

To the boric acid solution specified in Example 1, one gram of ammonium dichromate is added and the solution is stirred until a clear solution results. The dopant solution containing the polymer is otherwise prepared as in Example 1.

Thereafter, the aforesaid solution is applied (by spinning) onto the surface of a silicon wafer, and a continuous uniform thin film is formed thereon. A mask is applied over the dried coated wafer, with mask openings being preselected at the locations where dope diffusion is to take place. The masked wafer then is irradiated with light from an ultra-violet lamp until the irradiated dopant-coated portions become water-insoluble. The exposed wafer finally is dipped in water to dissolve the unexposed dopant film, whereupon a negative image of the mask remains deposited on the silicon surface.

Upon heating the wafer, as is done in Example 1, the doping chemical in the coated portions diffuses into the silicon surface to produce "p" type junctions. Replacement of the boric acid with other proper doping chemicals, as outlined in Example 1, will produce "n" type junctions.

I claim:

1. A process of doping preselected areas of a semiconductor surface, as described, comprising:
applying onto a masked surface of said semiconductor, a uniform continuous coating comprising an aqueous solution of a dopant and a water soluble polymeric carrier, and heating said coated semiconductor surface until the desired doping is accomplished.

2. A process, according to claim 1, in which said carrier is a polymer containing free hydroxy groups.

3. A process, according to claim 2, in which said carrier is a polyvinyl alcohol having a molecular weight above about 1000.

4. A process, according to claim 2, in which said carrier is a cellulose or cellulose derivative.

5. A process of doping preselected areas of a semiconductor surface, as described, comprising:
applying, onto a surface of said semiconductor, a uniform continuous coating comprising:
an aqueous solution of a dopant and a water soluble polymeric carrier and
a compound photosensitive to light,
applying, over said coated semiconductor, an opaque screen perforated in a predetermined pattern until the light passing through the perforations thereof insolubilizes the coating exposed thereby,
washing out portions of said coating which are soluble, and
subjecting said washed semiconductor to the action of heat until the dopant in the unwashed coating portions effects the desired dopant action on said surface.

6. A process, according to claim 5, in which said carrier is a polymer containing free hydroxy groups.

7. A process, according to claim 6, in which said carrier is a polyvinyl alcohol having a molecular weight above about 1000.

8. A process, according to claim 5, in which the photosensitive compound is a water soluble dichromate.

9. A dopant designed to dope a portion of a semiconductor surface, as described, comprising:
a doping chemical, present in doping concentration, and
a carrier comprising an aqueous solution of a polymeric compound.

10. A dopant, according to claim 9, in which said polymeric compound is a water soluble polymer containing free hydroxy groups.

11. A dopant, according to claim 10, in which said polymeric compound is a polyvinyl alcohol having a molecular weight of over about 1000.

12. A dopant, according to claim 9, in which the carrier also contains a photosensitive compound in concentration sufficient to insolubilize when exposed to light.

13. A dopant, according to claim 12, in which said photosensitive compound is a water-soluble dichromate.

References Cited

UNITED STATES PATENTS

| | | | |
|---|---|---|---|
| 3,084,079 | 4/1963 | Harrington | 148—188 |
| 3,415,648 | 12/1968 | Certa | 96—36.2 |
| 3,474,718 | 10/1969 | Guthrie | 117—212 |

HYLAND BIZOT, Primary Examiner

R. A. LESTER, Assistant Examiner

U.S. Cl. X.R.

29—576, 578; 96—36.2; 117—212; 148—187; 156—17